US009229075B2

(12) United States Patent
Cho et al.

(10) Patent No.: US 9,229,075 B2
(45) Date of Patent: Jan. 5, 2016

(54) METHOD OF CONTROLLING AN MRI SYSTEM AND AN APPARATUS THEREFOR

(75) Inventors: Hyug-rae Cho, Seoul (KR); Joon-soo Kim, Seoul (KR); Ju-hyung Lee, Gyeonggi-do (KR); Young-cheol Kwon, Gyeonggi-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 793 days.

(21) Appl. No.: 13/474,909

(22) Filed: May 18, 2012

(65) Prior Publication Data

US 2013/0069644 A1 Mar. 21, 2013

(30) Foreign Application Priority Data

Sep. 15, 2011 (KR) .................. 10-2011-0093047

(51) Int. Cl.
*G01V 3/00* (2006.01)
*G01R 33/36* (2006.01)

(52) U.S. Cl.
CPC ............ *G01R 33/36* (2013.01); *G01R 33/3657* (2013.01); *G01R 33/3621* (2013.01); *G01R 33/3692* (2013.01)

(58) Field of Classification Search
CPC ...................................................... G01R 33/54
USPC ................................................. 324/318, 322
See application file for complete search history.

(56) References Cited

U.S. PATENT DOCUMENTS

| 4,728,890 | A | * | 3/1988 | Pattany et al. ................. 324/309 |
| 4,775,835 | A | * | 10/1988 | Kikuchi ........................ 324/312 |
| 5,384,536 | A | | 1/1995 | Murakami et al. |
| 5,519,320 | A | * | 5/1996 | Kanayama et al. ........... 324/309 |
| 7,639,008 | B2 | | 12/2009 | Ookawa |
| 7,847,554 | B2 | | 12/2010 | Nistler et al. |
| 8,577,442 | B2 | | 11/2013 | Miyazaki |
| 2011/0103491 | A1 | * | 5/2011 | Saes et al. ..................... 375/241 |

FOREIGN PATENT DOCUMENTS

| CN | 101268943 A | 9/2008 |
| CN | 101308201 A | 11/2008 |
| CN | 101843485 A | 9/2010 |
| JP | 07-088099 A | 4/1995 |
| JP | 08-066380 A | 3/1996 |
| JP | 2008-508924 A | 3/2008 |
| JP | 2008-212437 A | 9/2008 |
| WO | 2009-147596 A1 | 12/2009 |

* cited by examiner

*Primary Examiner* — Louis Arana
(74) *Attorney, Agent, or Firm* — Cha & Reiter, LLC.

(57) ABSTRACT

A magnetic resonance imaging (MRI) system includes a radio frequency (RF) coil which receives timing information about a pulse sequence and stores the timing information in a memory of the RF coil. Then, when an RF excitation signal is transmitted, the RF coil performs decoupling. When a magnetic resonance (MR) echo signal is generated, the RF coil receives the MR echo signal and transmits the MR echo signal to a central controlling apparatus through a wireless channel. When a transmission error arises, the RF coil retransmits corresponding data in an idle time when the RF excitation signal is not transmitted or the MR echo signal is not generated. Thus, the RF coil is prevented from being damaged by the RF excitation signal and prevents the quality of an MR image from deteriorating compared to a synchronization-type communication method.

21 Claims, 6 Drawing Sheets

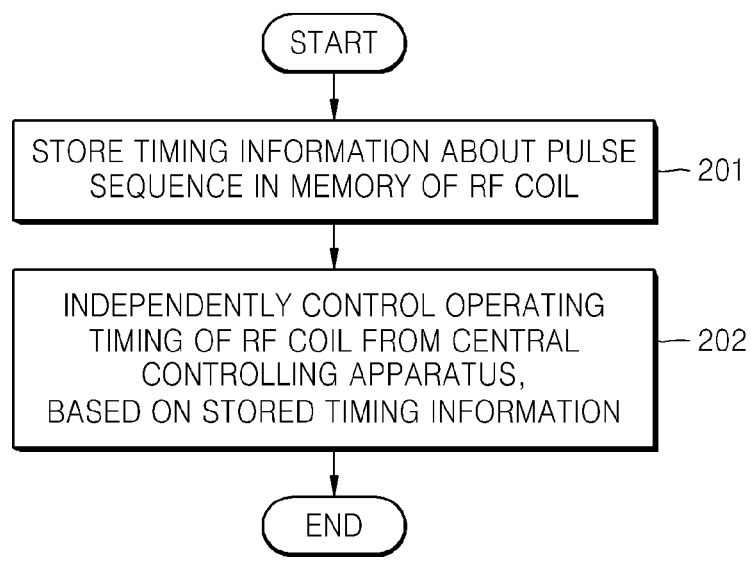
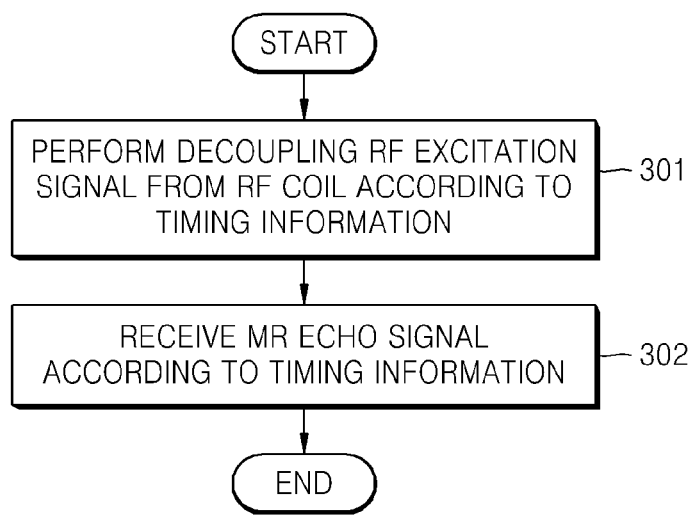

METHOD OF CONTROLLING AN MRI SYSTEM AND AN APPARATUS THEREFOR

CLAIM OF PRIORITY

This application claims, pursuant to 35 U.S.C. §119(a), priority to and the benefit of the earlier filing date of Korean Patent Application No. 10-2011-093047, filed on Sep. 15, 2011, in the Korean Intellectual Property Office, the disclosure of which is incorporated herein in its entirety by reference.

BACKGROUND OF THE INVENTION

1. Field of the Invention

The present invention relates to a method of controlling a radio frequency (RF) coil receiving a magnetic resonance (MR) echo signal in a magnetic resonance imaging (MRI) system and an apparatus for performing the method.

2. Description of the Related Art

A magnetic resonance imaging (MRI) system is an apparatus for obtaining a tomogram of a subject by indicating an intensity of a radio frequency (RF) signal having a predetermined frequency, which is generated from a magnetic field having a predetermined intensity, by using contrast.

FIG. 1 is a diagram showing a general MRI system in the prior art.

A patient is examined in a cylindrical gantry inside a shield room with shielding to prevent entry of any external RF signal from interfering with the RF signals used in the MRI procedure. A static magnetic field is formed in the gantry by a main magnet. A gradient coil 102 transmits a magnetic field gradient pulse to form a magnetic gradient field. An RF transmitter 101 applies an RF excitation signal having a predetermined frequency to the patient in order to obtain a tomogram of a predetermined portion of the patient. A magnetic resonance (MR) echo signal, generated due to magnetic resonance from the predetermined portion of the patient, is received by an RF coil 103 and is transmitted to a central controlling apparatus 100 in an operating room that is separated from the shield room. Signal processing is performed on the MR echo signal to obtain an MR image. An order of pulses (such as RF excitation signals or the magnetic gradient field), analyzed for obtaining the MR image, is referred to as a pulse sequence. The central controlling apparatus 100 controls the pulse sequence.

In general, the RF coil 103 uses a highly sensitive coil and a high-magnification amplifier in order to receive the MR echo signal having a very low intensity. Since the intensity of the RF excitation signal is several tens of thousands times higher than that of the MR echo signal, if the RF excitation signal is received by the RF coil 103, the RF coil 103 may be damaged. Thus, the following method has been used in the prior art such that, when the RF excitation signal is transmitted, the RF coil 103 does not receive the RF excitation signal by decoupling the RF coil 103 and the RF excitation signal. In addition, when the RF excitation signal is completely transmitted, the RF coil 103 receives the MR echo signal at a correct time. If an error arises in terms of a point of time when the MR echo signal is received, an artifact may appear in the MR image, so controlling the RF coil 103 at a correct time is a very important factor for determining the quality of the MR image.

Recently, research has been conducted into wireless communication between the gantry of the shield room and the central controlling apparatus 100 of the operating room. In the above-described method, analog-digital conversion of the MR echo signal is performed in the shield room, thereby minimizing noise due to an analog cable. That is, the central controlling apparatus 100 wirelessly controls decoupling of the RF coil 103 and receipt of the MR echo signal. Amplification of the MR echo signal received by the RF coil 103 and demodulation to a base band, as well as conversion to a digital signal, are performed inside the shield room. In addition, a digital signal is transmitted to the central controlling apparatus 100 and a signal processing apparatus through a wireless channel.

However, according to such a conventional wireless communication method in the prior art, when the RF coil 103 is not controlled at a correct time, the quality of an MR image may deteriorate. Since a delay due to demodulation and analog-digital conversion for wireless communication, and a delay occurring in a wireless channel are not constant, it is impossible to accurately control the RF coil 103 in real time. For example, since a general IEEE 802.11 based wireless local area network (LAN) assigns a time slot to a plurality of stations by using a time division method, it is difficult for an MRI system to ensure a quality of service (QoS) required to obtain an image having good quality. Thus, it is difficult to control the RF coil 103 in the prior art at a correct time.

In addition, a conventional wireless communication method in the prior art is a synchronization-type method in which decoupling of the RF coil 103 and receipt of the MR echo signal are controlled by the central controlling apparatus 100. In such a synchronization-type wireless MRI system, since the RF coil 103 is controlled in real time, even if an error in terms of data transmission arises during a wireless communication process, it is difficult to correct the error or to retransmit data due to a time delay that is likely to occur. As a result, the RF coil 103 may be damaged or the quality of an MR image may deteriorate.

SUMMARY OF THE INVENTION

The present invention provides a method and apparatus for accurately controlling a timing of the operation of a radio frequency (RF) coil according to a pulse sequence in a magnetic resonance imaging (MRI) system.

According to an aspect of the present invention, there is provided a method of controlling a radio frequency (RF) coil of a magnetic resonance imaging (MRI) system, the method including storing timing information about a pulse sequence in a memory of the RF coil before an RF excitation signal begins to be transmitted; and controlling the operation timing of the RF coil according to the timing information.

The controlling may include decoupling the RF coil from the RF excitation signal at a time when the RF excitation signal is transmitted, according to the timing information.

The controlling may include controlling the RF coil to begin to receive a magnetic resonance (MR) echo signal related to the RF excitation signal, according to the timing information.

The method may further include synchronizing a central controlling apparatus for controlling transmission of the RF excitation signal with a time of the RF coil before the RF excitation signal is transmitted.

The controlling may include independently controlling the operation timing of the RF coil from a central controlling apparatus.

The method may further include receiving the timing information from a central controlling apparatus through a wireless channel.

According to another aspect of the present invention, there is provided a method of controlling a radio frequency (RF)

coil of a magnetic resonance imaging (MRI) system, the method including transmitting data of a magnetic resonance (MR) echo signal related to an RF excitation signal to a central controlling apparatus through a wireless channel; storing the data in a buffer of the RF coil, which is capable of being randomly accessed; and when the data is not successfully transmitted to the central controlling apparatus, retransmitting the data stored in the buffer to the central controlling apparatus.

The method may further include storing timing information about a pulse sequence in a memory of the RF coil before an RF excitation signal begins to be transmitted, wherein the retransmitting includes determining a time when the data is retransmitted, according to the timing information.

The determining may include determining that the data is retransmitted at a time when the RF excitation signal is not transmitted and the MR echo signal is not generated, according to the timing information.

The method may further include receiving the timing information from the central controlling apparatus through a wireless channel.

According to another aspect of the present invention, there is provided a radio frequency (RF) coil apparatus for receiving a magnetic resonance (MR) echo signal in a magnetic resonance imaging (MRI) system, the RF coil apparatus including a memory for storing timing information about a pulse sequence in a memory of the RF coil before an RF excitation signal begins to be transmitted; and an RF coil controller for controlling operation timing of the RF coil according to the timing information.

The RF coil apparatus may further include a decoupling unit for decoupling the RF coil from the RF excitation signal at a time when the RF excitation signal is transmitted, according to control signals from the RF coil controller.

The RF coil apparatus may further include an echo receiving unit for beginning to receive a magnetic resonance (MR) echo signal at a time when the MR echo signal related to the RF excitation signal is generated, according to control signals from the RF coil controller.

The RF coil apparatus may further include a synchronization unit for synchronizing a central controlling apparatus for controlling transmission of the RF excitation signal with a time of operation of the RF coil before the RF excitation signal is transmitted.

The RF coil controller may independently control the operation timing of the RF coil from a central controlling apparatus.

The RF coil apparatus may further include a wireless communication unit for receiving the timing information from a central controlling apparatus through a wireless channel.

According to another aspect of the present invention, there is provided a radio frequency (RF) coil apparatus for receiving a magnetic resonance (MR) echo signal in a magnetic resonance imaging (MRI) system, the RF coil apparatus including a wireless communication unit for transmitting data of a magnetic resonance (MR) echo signal related to an RF excitation signal to a central controlling apparatus through a wireless channel; a buffer controller for storing the data in a buffer that is capable of being randomly accessed in the RF coil, wherein, when the data is not successfully transmitted to the central controlling apparatus, the wireless communication unit retransmits the data stored in the buffer to the central controlling apparatus.

The RF coil apparatus may further include a memory for storing timing information about a pulse sequence in a memory of the RF coil before an RF excitation signal begins to be transmitted, wherein the wireless communication unit determines a time when the data is retransmitted, according to the timing information.

The wireless communication unit may determine that the data is retransmitted at a time when the RF excitation signal is not transmitted and the MR echo signal is not generated, according to the timing information.

The RF coil apparatus may further include a wireless communication unit for receiving the timing information from the central controlling apparatus through a wireless channel.

According to another aspect of the present invention, there is provided a computer readable recording medium having recorded thereon a program for executing the method.

BRIEF DESCRIPTION OF THE DRAWINGS

The above and other features and advantages of the present invention will become more apparent from the following description describing in detail exemplary embodiments thereof with reference to the attached drawings in which:

FIG. 2 is a flowchart of a method of controlling a radio frequency (RF) coil, according to an exemplary embodiment of the present invention;

FIG. 3 is a flowchart of a method of controlling operation timing of the RF coil, according to the exemplary embodiment of the present invention;

DETAILED DESCRIPTION OF THE INVENTION

Figure 1:
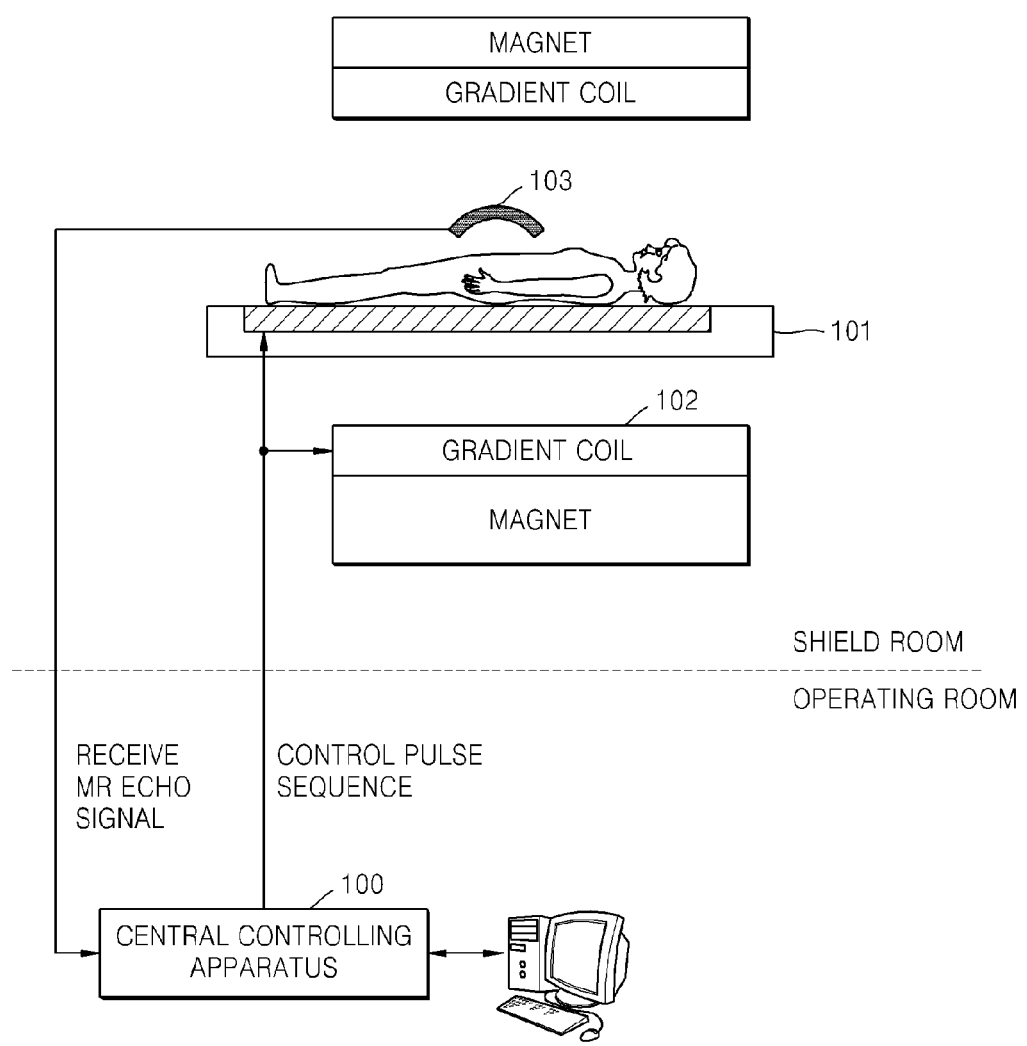
FIG. 1 is a diagram showing a general magnetic resonance imaging (MRI) system in the prior art.

Preferred embodiments of the present invention will now be described herein below with reference to the accompanying drawings, in which like reference numerals refer to like elements throughout, and in which exemplary embodiments of the invention are shown. This invention may, however, be embodied in many different forms and should not be construed as limited to the exemplary embodiments set forth herein. In the following description, a detailed explanation of known related functions and constructions may be omitted to avoid unnecessarily obscuring the subject matter of the present invention. Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

Figure 4:
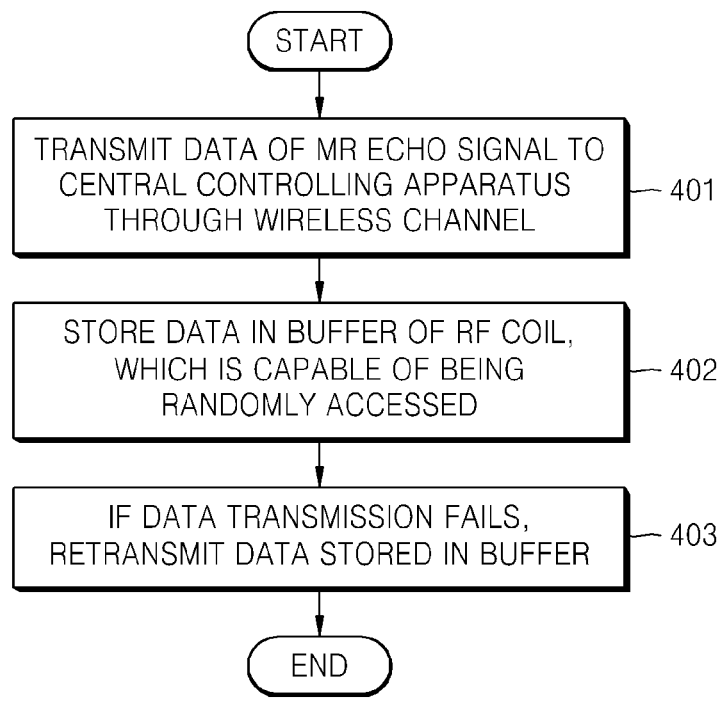
FIG. 4 is a flowchart of a method, performed by the RF coil, of processing data of a magnetic resonance (MR) echo signal, according to the exemplary embodiment of the present invention.
Figure 5:
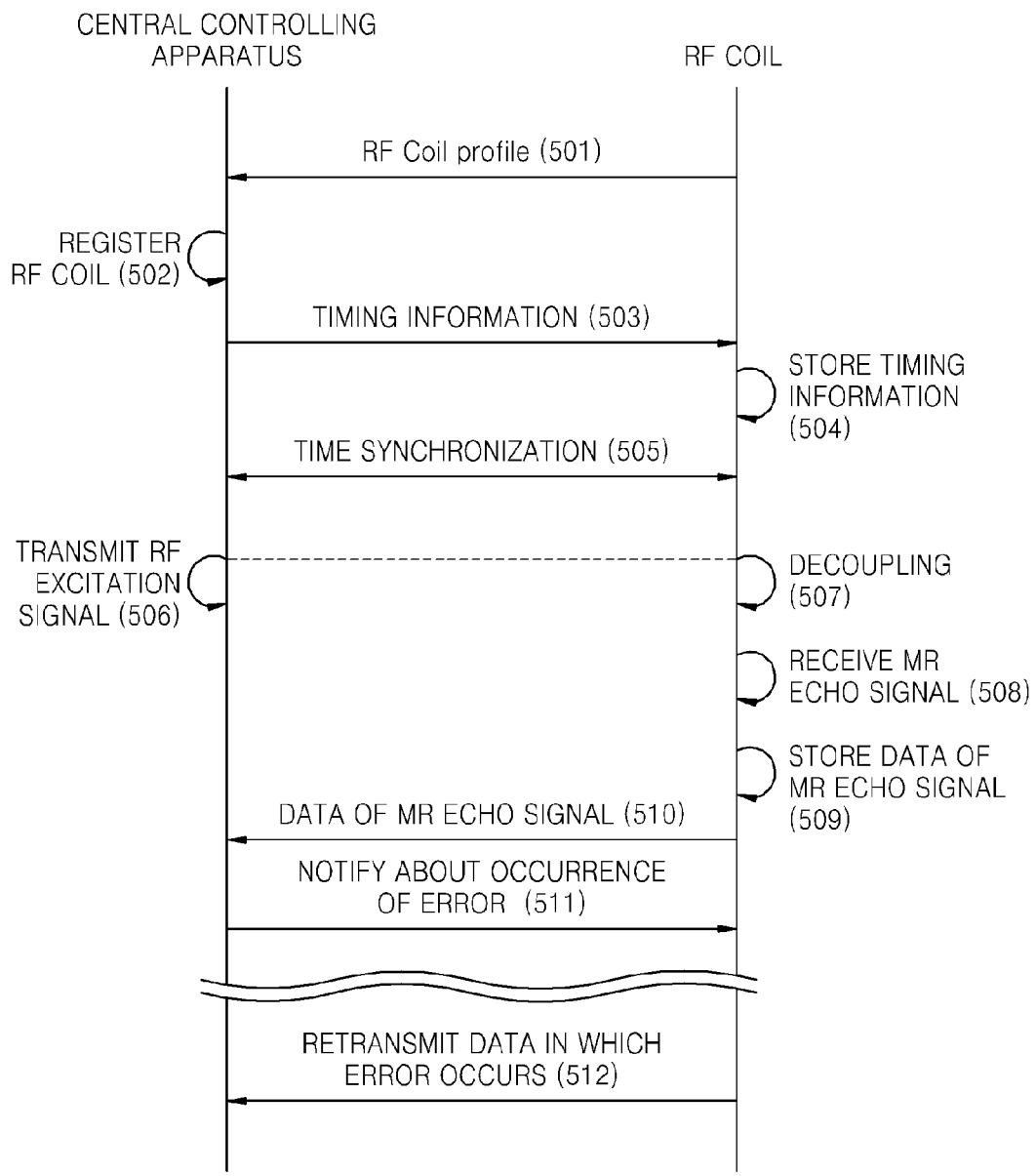
FIG. 5 is a signal flowchart of a communication method performed by the RF coil and a central controlling apparatus, according to the exemplary embodiment of the present invention.
Figure 6:
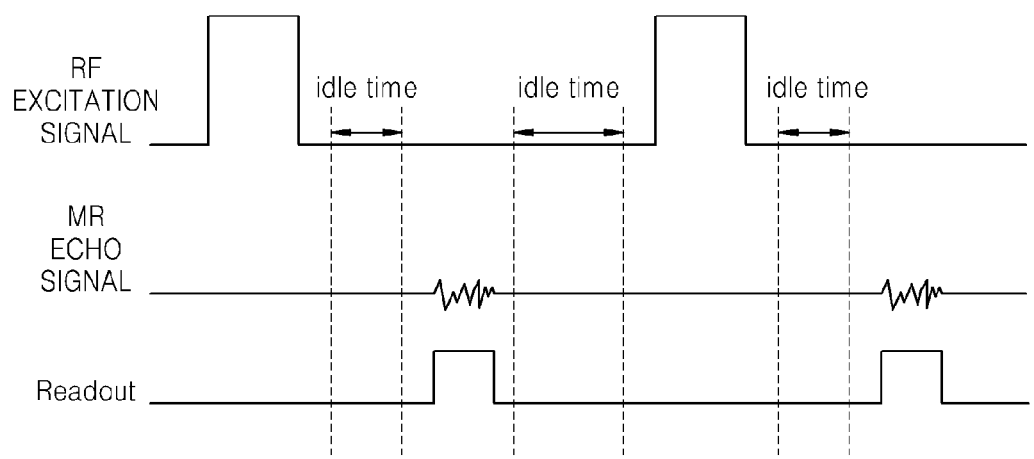
FIG. 6 is a diagram of a pulse sequence, according to the exemplary embodiment of the present invention.
Figure 7:
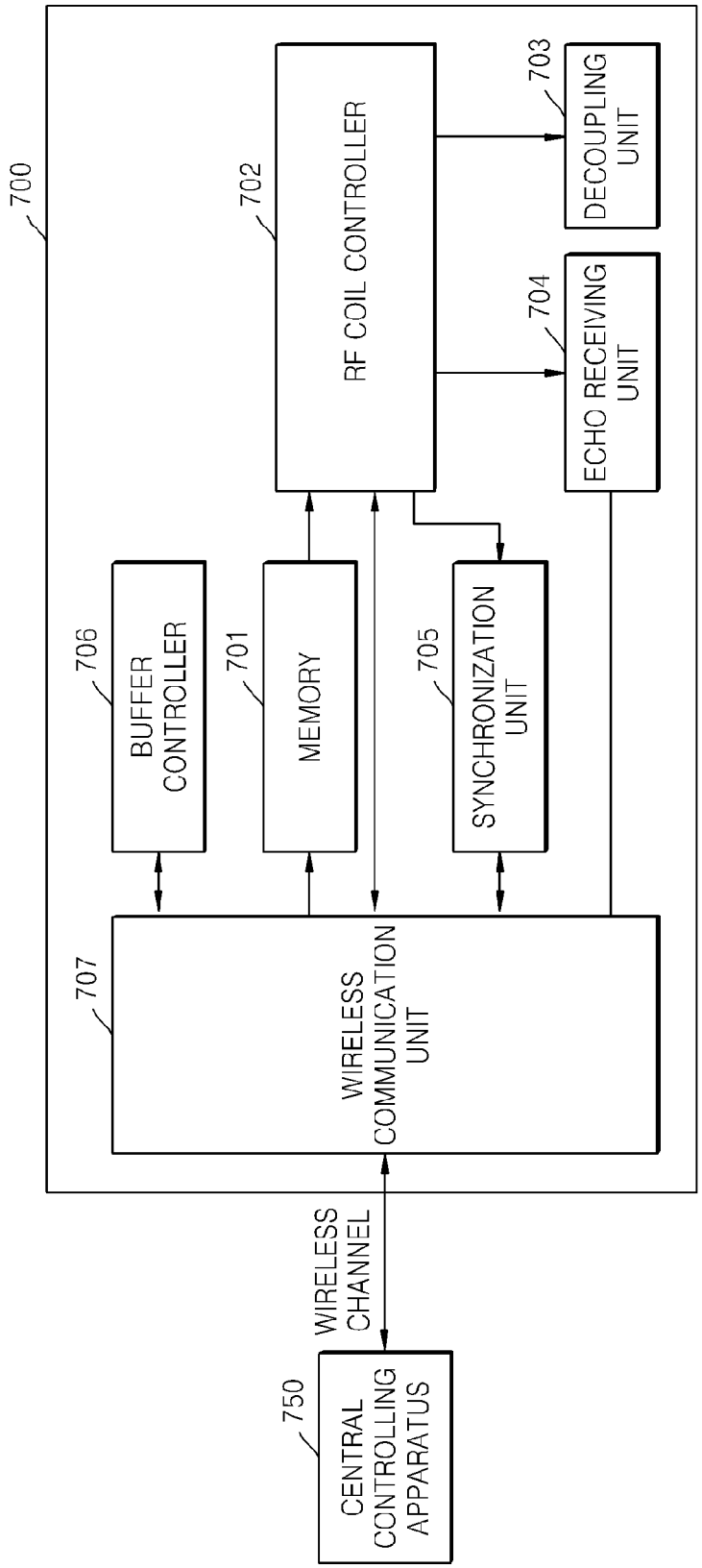
FIG. 7 is a diagram of the RF coil according to the exemplary embodiment of the present invention.

As described herein, exemplary embodiments of the control methods of the present invention are shown in FIGS. 2-5 in conjunction with an exemplary pulse sequence illustrated in FIG. 6 and an exemplary embodiment of components of the MRI system of the present invention shown in FIG. 7.

FIG. 7 is a diagram of the radio frequency (RF) coil 700 in greater detail operatively connected to a central controlling apparatus 750 in the MRI system, according to the exemplary embodiment of the present invention. Referring to FIG. 7, the RF coil 700 includes a memory 701, an RF coil controller 702, a decoupling unit 703, an echo receiving unit 704, a synchronization unit 705, a buffer controller 706, and a wireless communication unit 707.

The memory 701 stores timing information about a pulse sequence before an RF excitation signal is transmitted. In this case, the timing information does not have to include all time information about the pulse sequence, but includes at least information about a time when the RF excitation signal is to be transmitted and a time when the RF excitation signal is to be generated, that is, a time when the RF coil needs to receive the MR echo signal.

The RF coil controller 702 controls operation timing of the RF coil 700 according to the timing information stored in the memory 701. In particular, the RF coil controller 702 transmits a control signal to decouple the RF coil 700 from the RF excitation signal; that is, the RF coil 700 is prevented from receiving the RF excitation signal, while the RF excitation signal is transmitted, and may control the RF coil 700 to receive the MR echo signal while the MR echo signal is generated, according to the timing information. Thus, the RF coil controller 702 may control the operation timing of the RF coil 700, independent of the central controlling apparatus 750.

The decoupling unit 703 decouples the RF coil 700 from the RF excitation signal while the RF excitation signal is transmitted, in response to the control signal from the RF coil controller 702.

The echo receiving unit 704 receives the MR echo signal to match the time when the MR echo signal is generated, in response to control signals from the RF coil controller 702.

The synchronization unit 705 synchronizes a time of the RF coil 700 with a time of the central controlling apparatus 750 for controlling transmission of the RF excitation signal before the RF excitation signal is transmitted.

The buffer controller 706 stores data of the MR echo signal in a buffer (not shown) that is capable of being randomly accessed. In an alternative embodiment, the buffer may be included in the memory 701. The buffer needs to be capable of being randomly accessed since data in which a transmission error arises from among previously transmitted data needs to be immediately read in order to retransmit the data even though the data of accumulating MR echo signals continues to be stored.

The wireless communication unit 707 receives the timing information from the central controlling apparatus 750 through the wireless channel. The received timing information is stored in the memory 701.

In addition, the wireless communication unit 707 transmits the data of the MR echo signal related to the RF excitation signal, that is, digital data converted from the MR echo signal to the central controlling apparatus 750 through the wireless channel. When the data of the MR echo signal is successfully transmitted, the data stored in the buffer is read and retransmitted to the central controlling apparatus 750. In this case, the wireless communication unit 707 determines a time when the data is to be retransmitted according to the timing information. That is, the wireless communication unit 707 may determine, as the retransmission time, a time when the RF excitation signal is not transmitted and the MR echo signal is not generated. Furthermore, the wireless communication unit 707 may determine the retransmission time with reference to a state of the wireless channel.

In FIG. 7, components of the RF coil 700 are shown as separate blocks. However, it would be obvious to those of ordinary skill in the art that two or more blocks may be integrated together according to a design choice or an implementation choice. For example, the memory 701 and the RF memory controller 702 may be embodied as a single chip or may be separately embodied.

FIG. 2 is a flowchart of a method of controlling a radio frequency (RF) coil, such as the RF coil 700 shown in FIG. 7, according to the exemplary embodiment of the present invention.

Referring to FIG. 2, in step 201, the RF coil 700 stores timing information about a pulse sequence in the memory 701 inside the RF coil 700 before an RF excitation signal is transmitted. An example pulse sequence is shown in FIG. 6. In this case, the timing information about the pulse sequence does not have to include all the time information about the pulse sequence, but includes at least information about a time when the RF excitation signal is to be transmitted and a time when the RF coil 700 needs to receive an MR echo signal related to the RF excitation signal.

In step 202, operation timing of the RF coil 700 is independently controlled based on the stored timing information. In particular, the RF coil 700 controls its operating timing independent from the central controlling apparatus 750, based on the stored timing information.

That is, according to the present embodiment, the RF coil 700 operates according to the stored timing information by using an asynchronization method rather than being controlled in real time by the central controlling apparatus 750 by using a synchronization method. Accordingly, since the RF coil 700 receives the timing information about the pulse sequence, the RF coil 700 previously stores the timing information in the memory 701 of the RF coil 700, and then operates according to the timing information, so that the RF coil 700 may accurately perform decoupling according to the pulse sequence and may receive a magnetic resonance (MR) echo signal at a correct time. Thus, the operation timing of the RF coil 700 is controlled independently from the central controlling apparatus 750.

FIG. 3 is a flowchart of a method of controlling operation timing of the RF coil 700, according to the exemplary embodiment of the present invention.

In step 301, the RF coil 700 performs decoupling between the RF coil 700 and an RF excitation signal according to the timing information that was previously stored; for example, in the memory 701. In this case, the decoupling refers to all processes for configuring the RF coil 700 in order to prevent the RF coil 700 from being damaged by the RF excitation signal. For example, the decoupling may be an operation of powering off the RF coil 700 while the RF excitation signal is transmitted, and/or may be an operation of setting a receipt channel or receipt frequency of the RF coil 700, which is different from the RF excitation signal, or the like, and so the RF coil 700 is prevented from receiving the RF excitation signal while the RF excitation signal is transmitted.

That is, when (or before) a transmission time of the RF excitation signal arrives, in which the transmission time is contained in the timing information, the decoupling between the RF coil 700 and the RF excitation signal is performed to prevent the RF coil 700 from being damaged by the RF excitation signal. In order to perform the decoupling of the RF coil 700 at a correct time, an internal clock of the RF coil 700 may be synchronized with a clock of a central controlling apparatus for controlling transmission of the RF excitation signal. The internal clock may be implemented in the RF coil controller 702 or in other components of the RF coil 700 shown in FIG. 7, and/or may be a separate internal clock device included in the RF coil 700.

Such synchronization may be previously set in the timing information, may be performed at a predetermined point of time before the transmission time of the RF excitation signal, or may be periodically performed. In addition, a process for clock synchronization may be initiated in the RF coil 700 or may be initiated in the central controlling apparatus 750.

In step 302 of FIG. 3, the RF coil 700 receives the MR echo signal according to the timing information. That is, the RF coil 700 begins to receive the MR signal according to the timing information when a predetermined period of time elapses after the RF excitation signal is transmitted.

FIG. 4 is a flowchart of a method, performed by the RF coil 700, of processing data of an MR echo signal, according to the exemplary embodiment of the present invention.

In step 401, digital data converted from the MR echo signal of the RF excitation signal, that is, data of the MR echo signal, is transmitted to a central controlling apparatus 750 through a wireless channel.

In step 402, the same data as the data transmitted in step 401 is stored in a buffer of the RF coil 700, which is capable of being randomly accessed. In an alternative embodiment, the order of the steps 401 and 402 in FIG. 4 may be reversed.

In step 403, if data transmission fails, the data stored in the buffer is retransmitted from the RF coil 700 to the central controlling apparatus 750. In this case, a time for the retransmission may be determined as an idle time when the RF excitation signal is not transmitted and the MR echo signal is not generated, in order to prevent interference between signals and occurrence of noise. To this end, reference needs to be made to the timing information of the pulse sequence. Thus, according to the present embodiment, before the RF excitation signal is transmitted, the RF coil 700 may previously receive the timing information from the central controlling apparatus 750 through a wireless channel, and may store the timing information in the memory 701 and/or the buffer of the RF coil 700.

FIG. 5 is a signal flowchart of a communication method performed by the RF coil 700 and the central controlling apparatus 750, according to the exemplary embodiment of the present invention.

In step 501, the RF coil 700 transmits profile information of the RF coil 700 to the central controlling apparatus 750. The profile information includes at least an identifier, such as a serial number or other indicator, which identifies and corresponds to each RF coil. The profile information may include additional information, such as specification information, such as operating voltage or other parameters, associated with each RF coil. Accordingly, multiple RF coils may be managed and controlled by the central controlling apparatus 750.

In step 502, the central controlling apparatus 750 registers each RF coil, such as the RF coil 700 of FIG. 7. Since the central controlling apparatus 750 may manage a plurality of RF coils, and since portions of a human body, which are to be MRI photographed, may be different for respective RF coils, an appropriate RF coil that is to receive an RF signal needs to be determined. Thus, the central controlling apparatus 750 may separately manage the RF coils according to the profile information of each RF coil.

In step 503, the central controlling apparatus 750 transmits the timing information about the pulse sequence to the appropriate RF coil; for example, the RF coil 700 of FIG. 7. The timing information does not have to include all of the time information about the pulse sequence, but includes at least information about a time when the RF excitation signal is to be transmitted and a time when the RF coil 700 needs to receive an MR signal of the RF excitation signal.

In step 504, the RF coil 700 stores the timing information in the memory 701 of the RF coil 700.

In step 505, the RF coil 700 synchronizes with the timing of the central controlling apparatus 750. According to the present embodiment, since the RF coil 700 begins to perform decoupling or to receive the MR signal at a predetermined point of time, which is previously determined according to the timing information received from the central controlling apparatus 750, rather than receiving a real time command from the central controlling apparatus 750, time synchronization between the RF coil 700 and the central controlling apparatus 750 for controlling transmission of the RF excitation signal is very important.

The type of the synchronization protocol, the number of processes for synchronization, or a time for the synchronization is not specifically required for implementing the present invention. However, the time synchronization needs to be performed before the RF excitation signal is transmitted.

In step 506, the central controlling apparatus 750 controls an RF transmitter of a gantry in an MRI system to begin to transmit the RF excitation signal according to a point of time that is determined in the timing information.

In step 507, the RF coil 700 performs decoupling from the RF excitation signal when the RF excitation signal begins to be transmitted or at a point of time before the RF excitation signal begins to be transmitted.

In step 508, the RF coil 700 receives the MR echo signal. A point of time when the MR echo signal begins to be received is determined according to the timing information. That is, the timing information contains the point of time when the MR echo signal needs to be received.

In step 509, the RF coil 700 receives the MR echo signal, converts the MR echo signal into digital data, and then stores the MR echo signal in the buffer. In this case, the buffer may use a method that is capable of being randomly accessed instead of a general first-in-first-out (FIFO) method. When a transmission error arises in data that is transmitted by the RF coil 700 to the central controlling apparatus 750, the RF coil 700 needs to read the data from the buffer and to retransmit the data. This is because the digital data associated with multiple received MR echo signals may accumulate until the data is stored in the buffer and is read in order to retransmit the data.

In step 510, the RF coil 700 transmits the data of the MR echo signal, that is, digital data converted from the MR echo signal to the central controlling apparatus 750 through a wireless channel, such as shown in FIG. 7.

In step 511, the central controlling apparatus 750 notifies the RF coil 700 that the data transmitted in step 509 was not successfully received.

In step 512, the RF accesses the buffer and transmits the data, in which a transmission error has arisen, to the central controlling apparatus 750. As described above, if the RF coil 700 and the central controlling apparatus 750 were to communicate with each other as in a conventional synchronization method of the prior art, since a transmission error is not corrected or data is not retransmitted in spite of the transmission error, it is difficult to accurately control operation of the RF coil 700 and the quality of the MR image deteriorates.

However, according to the present invention, since the RF coil 700 and the central controlling apparatus 750 communicate with each other by using an asynchronization method, even though the RF coil 700 retransmits the data, in which an error arose, to the central controlling apparatus 750, a time delay does not occur. This is because since the RF coil 700 already recognizes a time when decoupling is to be performed and a time when the MR echo signal is to be received, from the timing information, the RF coil 700 does not have to communicate with the central controlling apparatus 750 in order for the RF coil 700 to operate by receiving a separate control command, as in the prior art, to retransmit the data to correct a data error.

However, since a wireless signal transmitted between the RF coil 700 and the central controlling apparatus 750 interferes with the RF excitation signal or the MR echo signal, a time for the transmission of data may be determined with reference to the timing information, which will be described in detail with reference to FIG. 6.

FIG. 6 is a diagram of a pulse sequence, according to the exemplary embodiment of the present invention.

Referring to FIG. 6, an RF transmitter in the MRI system, in which the RF coil 700 and the central controlling apparatus 750 are included, transmits an RF excitation signal and applies the RF excitation signal to a patient according to control signals from the central controlling apparatus 750. An MR echo signal that is generated due to magnetic resonance is received by the RF coil 700 after a predetermined period of time elapses after the RF excitation signal is applied.

The RF coil 700 may then readout the MR echo signal which is transmitted to the central controlling apparatus 750 during the readout interval shown in FIG. 6.

A process of the RF coil 700 that retransmits data to the central controlling apparatus 750 may be performed in an idle time in the pulse sequence of FIG. 6, when the RF excitation signal is not transmitted and the MR echo signal is not generated. As describe above, this is because wireless communication through the wireless channel between the RF coil 700 and the central controlling apparatus 750 may interfere with the RF excitation signal or the MR echo signal.

Thus, the RF coil 700 may determine the idle time with reference to the timing information received from the central controlling apparatus 750, and may retransmit data in the idle time. For example, the idle time may be a time interval between the RF excitation signal and the MR echo signal related thereto, or a time interval between the MR echo signal and a next RF excitation signal, in the pulse sequence shown in FIG. 6.

The above-described apparatus and methods according to the present invention can be implemented in hardware, firmware or as software or computer code that can be stored in a recording medium such as a CD ROM, a RAM, a ROM, a floppy disk, DVDs, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods described herein can be rendered in such software that is stored on the recording medium using a general purpose computer, a digital computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of controlling a radio frequency (RF) coil of a magnetic resonance imaging (MRI) system, the method comprising:
    storing timing information about a pulse sequence in a memory of the RF coil for asynchronous control of the RF coil prior to a transmission of an RF excitation signal; and
    controlling operation timing of the RF coil according to the timing information.

2. The method of claim 1, wherein the controlling comprises decoupling the RF coil from the RF excitation signal at a time when the RF excitation signal is transmitted, according to the timing information.

3. The method of claim 1, wherein the controlling comprises controlling the RF coil to begin to receive a magnetic resonance (MR) echo signal related to the RF excitation signal, according to the timing information.

4. The method of claim 1, further comprising performing a time synchronization between the central controlling apparatus and the RF coil before the RF excitation signal begins to be transmitted, with the central controlling apparatus controlling transmission of the RF excitation signal.

5. The method of claim 1, wherein the controlling comprises controlling the operation timing of the RF coil independent of a central controlling apparatus.

6. The method of claim 1, further comprising receiving the timing information from a central controlling apparatus through a wireless channel.

7. A method of controlling a radio frequency (RF) coil of a magnetic resonance imaging (MRI) system, the method comprising:
    storing timing information about a pulse sequence in a memory of the RF coil for asynchronous control of the RF coil prior to a transmission of an RF excitation signal,
    transmitting data of a magnetic resonance (MR) echo signal related to the RF excitation signal to a central controlling apparatus through a wireless channel;
    storing the data in a buffer of the RF coil; and
    when the data is not successfully transmitted to the central controlling apparatus, retransmitting the data stored in the buffer to the central controlling apparatus.

8. The method of claim 7,
    wherein the retransmitting comprises determining a time when the data is retransmitted, according to the timing information.

9. The method of claim 8, wherein the determining comprises determining that the data is retransmitted at a time when the RF excitation signal is not transmitted and the MR echo signal is not generated, according to the timing information.

10. The method of claim 8, further comprising receiving the timing information from the central controlling apparatus through a wireless channel.

11. A radio frequency (RF) coil apparatus for receiving a magnetic resonance (MR) echo signal in a magnetic resonance imaging (MRI) system, the RF coil apparatus comprising:
- a memory for storing timing information about a pulse sequence prior to transmission of an RF excitation signal; and
- an RF coil controller for asynchronous control of an RF coil controlling operation timing of the RF coil apparatus according to the timing information.

12. The RF coil apparatus of claim 11, further comprising a decoupling unit for decoupling the RF coil apparatus from the RF excitation signal at a time when the RF excitation signal is transmitted, according to a control signal from the RF coil controller.

13. The RF coil apparatus of claim 11, further comprising an echo receiving unit for beginning to receive a magnetic resonance (MR) echo signal at a time when the MR echo signal related to the RF excitation signal is generated, according to a control signal from the RF coil controller.

14. The RF coil apparatus of claim 11, further comprising a synchronization unit for performing a time synchronization between the central controlling apparatus and the RF coil apparatus before the RF excitation signal begins to be transmitted, with the central controlling apparatus controlling transmission of the RF excitation signal.

15. The RF coil apparatus of claim 11, wherein the RF coil controller controls the operation timing of the RF coil apparatus independent of a central controlling apparatus.

16. The RF coil apparatus of claim 11, further comprising a wireless communication unit for receiving the timing information from a central controlling apparatus through a wireless channel.

17. A radio frequency (RF) coil apparatus for receiving a magnetic resonance (MR) echo signal in a magnetic resonance imaging (MRI) system, the RF coil apparatus comprising:
- a memory for storing timing information transmitted to the RF coil prior to a transmission of an RF excitation signal being transmitted to the RF coil, the timing information regarding a pulse sequence for asynchronous control of the RF coil;
- a wireless communication unit for transmitting data of a magnetic resonance (MR) echo signal related to the RF excitation signal to a central controlling apparatus through a wireless channel;
- a buffer controller for storing the data in a buffer,
- wherein, when the data is not successfully transmitted to the central controlling apparatus, the wireless communication unit retransmits the data stored in the buffer to the central controlling apparatus.

18. The RF coil apparatus of claim 17, wherein the wireless communication unit determines a time when the data is retransmitted, according to the timing information.

19. The RF coil apparatus of claim 18, wherein the wireless communication unit determines that a retransmission time when the RF excitation signal is not transmitted and the MR echo signal is not generated, according to the timing information.

20. The RF coil apparatus of claim 17, further comprising a wireless communication unit for receiving the timing information from the central controlling apparatus through a wireless channel.

21. A computer readable recording medium having recorded thereon a program for executing the method of claim 1.

* * * * *